(12) United States Patent
Liu (10) Patent No.: US 9,257,358 B2
(45) Date of Patent: Feb. 9, 2016

(54) CHIP STACKING PACKAGING STRUCTURE

(71) Applicant: Huawei Technologies Co., Ltd., Shenzhen (CN)

(72) Inventor: Weifeng Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/552,674

(22) Filed: Nov. 25, 2014

(65) Prior Publication Data

US 2015/0076686 A1 Mar. 19, 2015

Related U.S. Application Data

(63) Continuation of application No. PCT/CN2012/083609, filed on Oct. 26, 2012.

(30) Foreign Application Priority Data

May 25, 2012 (CN) .......................... 2012 1 0165554

(51) Int. Cl.
*H01L 23/34* (2006.01)
*H01L 23/367* (2006.01)
*H01L 23/00* (2006.01)
*H01L 25/065* (2006.01)
(Continued)

(52) U.S. Cl.
CPC .............. *H01L 23/34* (2013.01); *H01L 23/367* (2013.01); *H01L 23/5389* (2013.01); *H01L 24/20* (2013.01); *H01L 25/0652* (2013.01); *H01L 25/10* (2013.01); *H01L 25/18* (2013.01); *H05K 1/185* (2013.01); *H05K 3/4697* (2013.01); *H01L 23/3736* (2013.01); *H01L 2224/12105* (2013.01); *H01L 2224/16225* (2013.01); *H01L 2224/16227* (2013.01); *H01L 2224/73267* (2013.01); *H01L2225/1035* (2013.01); *H01L 2924/12042* (2013.01)

(58) Field of Classification Search
CPC ..... H01L 23/34; H01L 25/18; H01L 25/0657; H01L 25/10; H01L 24/20; H01L 23/24
See application file for complete search history.

(56) References Cited

U.S. PATENT DOCUMENTS 4,266,282 A 5/1981 Henle et al.
5,362,986 A 11/1994 Angiulli et al.
(Continued)

FOREIGN PATENT DOCUMENTS

CN 1532930 A 9/2004
CN 101604685 A 12/2009
(Continued)

OTHER PUBLICATIONS

Partial English Translation and Abstract of Chinese Patent Application No. CN101604685A, Sep. 18, 2014, 25 pages.
(Continued)

*Primary Examiner* — William Coleman
(74) *Attorney, Agent, or Firm* — Conley Rose, P.C.; Grant Rodolph; Nicholas K. Beaulieu (57) ABSTRACT

A chip stacking packaging structure is provided for achieving high-density stacking and improving a heat dissipation efficiency of the chip stacking packaging structure. The chip stacking packaging structure includes a main substrate and at least one stacking substrate in which a main chip is disposed in the main substrate, at least one stacking chip is disposed on the stacking substrate, and a side edge of the stacking substrate is disposed on the main substrate, so that the stacking chip is connected to the main chip.

10 Claims, 7 Drawing Sheets

(51) Int. Cl.
*H01L 25/10* (2006.01)
*H01L 23/538* (2006.01)
*H05K 1/18* (2006.01)
*H05K 3/46* (2006.01)
*H01L 25/18* (2006.01)
*H01L 23/373* (2006.01)

(56) References Cited

U.S. PATENT DOCUMENTS

| | | | |
|---|---|---|---|
| 5,530,623 | A | 6/1996 | Sanwo et al. |
| 6,075,287 | A * | 6/2000 | Ingraham et al. ............ 257/706 |
| 8,081,474 | B1 * | 12/2011 | Zohni et al. ................... 361/719 |
| 2003/0011993 | A1 * | 1/2003 | Summers et al. ............. 361/704 |
| 2005/0110166 | A1 | 5/2005 | Aoyagi |
| 2006/0221573 | A1 * | 10/2006 | Li ................................. 361/704 |
| 2007/0181988 | A1 | 8/2007 | Han et al. |
| 2007/0258217 | A1 * | 11/2007 | Roper et al. ................... 361/709 |
| 2008/0063652 | A1 * | 3/2008 | Pykett et al. ................ 424/184.1 |
| 2009/0091903 | A1 | 4/2009 | Hsu et al. |
| 2009/0166065 | A1 * | 7/2009 | Clayton et al. ................ 174/254 |
| 2010/0047964 | A1 | 2/2010 | Farooq et al. |
| 2013/0008482 | A1 * | 1/2013 | Stancel et al. ................ 136/244 |

FOREIGN PATENT DOCUMENTS

| | | |
|---|---|---|
| CN | 102124562 A | 7/2011 |
| CN | 102693968 A | 9/2012 |
| WO | 2010020437 A1 | 2/2010 |

OTHER PUBLICATIONS

Partial English Translation and Abstract of Chinese Patent Application No. CN102693968A, Sep. 18, 2014, 2 pages.

Foreign Communication from a Counterpart Application, Chinese Application No. 201210165554.8, Chinese Office Action dated Apr. 1, 2014, 7 pages.

Foreign Communication from a Counterpart Application, PCT Application No. PCT/CN2012/083609, English Translation of International Search Report dated Mar. 7, 2013, 3 pages.

Foreign Communication from a Counterpart Application, PCT Application No. PCT/CN2012/083609, English Translation of Written Opinion dated Mar. 7, 2013, 14 pages.

Foreign Communication from a Counterpart Application, European Application No. 12877457.7, Extended European Search Report dated Jan. 28, 2015, 6 pages.

* cited by examiner

CHIP STACKING PACKAGING STRUCTURE

CROSS-REFERENCE TO RELATED APPLICATIONS

This application is a continuation of International Application No. PCT/CN2012/083609, filed on Oct. 26, 2012, which claims priority to Chinese Patent Application No. 201210165554.8, filed on May 25, 2012, both of which are hereby incorporated by reference in their entireties.

TECHNICAL FIELD

The present invention relates to the field of chip packaging technologies, and in particular, to a chip stacking packaging structure.

BACKGROUND

To meet a requirement for high density and miniaturization of integrated circuits, chip stacking has become a development trend of integrated circuits. In the prior art, a chip stacking manner is generally placing a chip horizontally, and stacking one or more chips on the chip vertically upward layer by layer. The chips may be connected to each other by means of laser drilling, that is, holes are formed in the stacked chips using a laser, and then the chips are connected to each other by electroplating.

For a chip stacking packaging structure in the prior art, since chips are closely stacked horizontally, such a stacking manner leads to low heat dissipation performance of the chips. Heat generated by the chips can only be conducted to the outside through metal wiring and a material of chips themselves, resulting in a low heat conduction efficiency. In addition, since a high-power chip and a low-power chip are stacked together, the temperature of the low-power chip increases under influence of the high-power chip, thereby affecting performance of the chip.

SUMMARY

A technical issue to be solved by the present invention is to provide a chip stacking packaging structure, so as to achieve high-density stacking of chips, and improve a heat dissipation efficiency of the chip stacking packaging structure.

According to a first aspect of the present invention, a chip stacking packaging structure includes a main substrate and at least one stacking substrate, where a main chip is disposed in the main substrate, and at least one stacking chip is disposed on the stacking substrate; and a side edge of the stacking substrate is disposed on the main substrate, so that the stacking chip is connected to the main chip.

In a first possible implementation manner of the first aspect, the stacking substrate is disposed on the main substrate perpendicularly.

In a second possible implementation manner of the first aspect, the at least one stacking substrate includes a plurality of stacking substrates, and the plurality of stacking substrates is spaced from each other.

In a third possible implementation manner of the first aspect, the chip stacking packaging structure further includes at least one heat radiating fin, where the heat radiating fin is disposed on the main substrate, and the heat radiating fin and the stacking substrate are spaced from each other.

In a fourth possible implementation manner of the first aspect, the chip stacking packaging structure further includes a metal radiator, where the metal radiator is disposed on the main substrate and corresponds to a position at which the main chip is disposed, and the metal radiator and the stacking substrate are spaced from each other.

In a fifth possible implementation manner of the first aspect, the stacking chip is disposed on a surface of the stacking substrate or disposed inside the stacking substrate, and the main chip is disposed on a surface of the main substrate or disposed inside the main substrate.

In a sixth possible implementation manner of the first aspect, one surface or two surfaces of the stacking substrate are covered with a copper foil.

In a seventh possible implementation manner of the first aspect, the main substrate includes a main chip substrate, circuit wiring, a laminated sheet, a main chip, a chip connection area, a lower surface substrate, and an upper surface substrate provided with a plurality of connection holes, where the circuit wiring is disposed on an upper surface and a lower surface of the main chip substrate; the main chip is disposed on the upper surface of the main chip substrate and is connected to the circuit wiring; the laminated sheet is disposed on the circuit wiring on the upper surface of the main chip substrate; the upper surface substrate is disposed on the main chip and the laminated sheet; the lower surface substrate is disposed below the circuit wiring on the lower surface of the main chip substrate; positions of the plurality of connection holes correspond to a position of an input/output interface of the main chip and a position of the circuit wiring separately; a conductive medium is disposed in the connection holes, and the conductive medium is connected to the input/output interface of the main chip or the circuit wiring; the chip connection area covers openings at one side of the connection holes that is distant from the main chip, and is connected to the conductive medium; and the chip connection area is used to connect the stacking substrate.

In an eighth possible implementation manner of the first aspect, the stacking substrate includes a stacking chip substrate, circuit wiring, a laminated sheet, a stacking chip, external wiring, a solder pad, a lower surface substrate, and an upper surface substrate provided with a plurality of connection holes, where the circuit wiring is disposed on an upper surface and a lower surface of the stacking chip substrate; the stacking chip is disposed on the upper surface of the stacking chip substrate and is connected to the circuit wiring; the laminated sheet is disposed on the circuit wiring on the upper surface of the stacking chip substrate; the upper surface substrate is disposed on the stacking chip and the laminated sheet; the lower surface substrate is disposed below the circuit wiring on the lower surface of the stacking chip substrate; positions of the plurality of connection holes correspond to a position of an input/output interface of the stacking chip and a position of the circuit wiring separately; a conductive medium is disposed in the connection holes, and the conductive medium is connected to the input/output interface of the stacking chip or the circuit wiring; the solder pad is disposed at a bottom end of an outer side face of the upper surface substrate, and the solder pad is used to connect the main substrate; and the external wiring is disposed on the outer side face of the upper surface substrate, and two ends of the external wiring are connected to the solder pad and the conductive medium separately.

In the chip stacking packaging structure provided by embodiments of the present invention, the side edge of the stacking substrate is disposed on the main substrate, thereby achieving high-density stacking of chips; and the stacking chip is connected to the main chip by disposing the side edge of the stacking substrate on the main substrate, so that the stacking substrate functions like a radiating tooth in a metal radiator. In this way, in a case of forced air cooling, heat of the chips can be quickly taken away, and thermal interference between the chips is avoided, thereby effectively achieving efficient heat dissipation of the stacked chips. In addition, since the stacking substrate is disposed on the main substrate vertically, a length of wiring between the stacking chip and the main chip is greatly reduced compared with the prior art, thereby improving electrical performance of the chip packaging structure.

BRIEF DESCRIPTION OF DRAWINGS

To describe the technical solutions in the embodiments of the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. The described embodiments are a part rather than all of the embodiments of the present invention. All other embodiments obtained by a person of ordinary skill in the art based on the embodiments of the present invention without creative efforts shall fall within the protection scope of the present invention.

Figure 1:
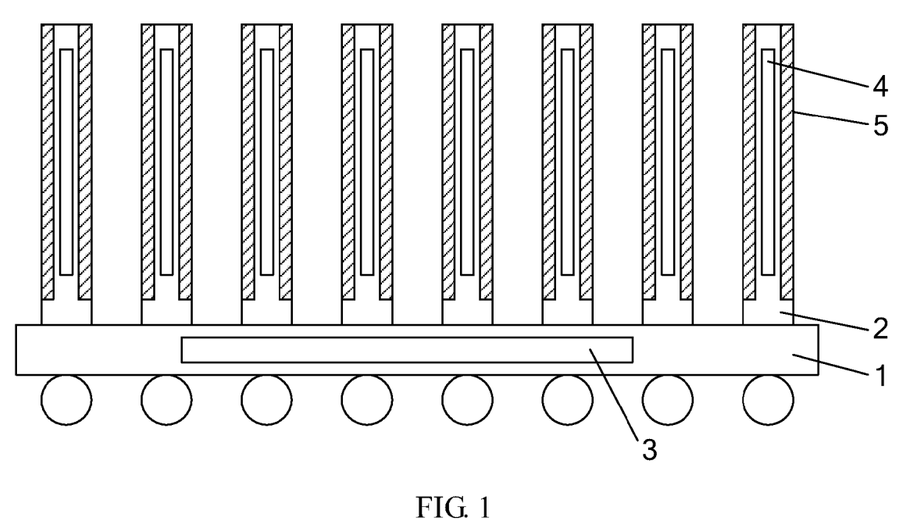
FIG. 1 is a schematic diagram of a chip stacking packaging structure provided by an embodiment of the present invention.

An embodiment of the present invention provides a chip stacking packaging structure, and as shown in FIG. 1, the structure includes a main substrate 1 and at least one stacking substrate 2, where a main chip 3 is disposed in the main substrate 1, and at least one stacking chip 4 is disposed on the stacking substrate 2; and a side edge of the stacking substrate 2 is disposed on the main substrate 1, so that the stacking chip 4 is connected to the main chip 3.

In the embodiment of the present invention, the side edge of the stacking substrate 2 is disposed on the main substrate 1. This structure is similar to the structure of a metal radiator, and the stacking substrate 2 functions as a radiating tooth in the metal radiator. The stacking substrate 2 may be disposed on the main substrate 1 perpendicularly or at any angle.

In the chip stacking packaging structure provided by the embodiment of the present invention, the side edge of the stacking substrate 2 is disposed on the main substrate 1, thereby achieving high-density stacking of chips; and such a configuration enables the stacking substrate 2 to function like a radiating tooth in a metal radiator. In this way, in a case of forced air cooling, heat of the chips can be quickly taken away, and thermal interference between the chips (between the stacking chip and the main chip or between the stacking chips) is avoided, thereby effectively achieving efficient heat dissipation of the stacked chips. In addition, since the side edge of the stacking substrate 2 is disposed on the main substrate 1, a length of wiring between the stacking chip 4 and the main chip 3 is greatly reduced compared with the prior art, thereby improving electrical performance of the chip packaging structure.

In an embodiment of the present invention, as shown in FIG. 1 to FIG. 7, the stacking substrate 2 is disposed on the main substrate 1 perpendicularly, so that the stacking chip 4 is connected to the main chip 3 vertically, thereby achieving high-density stacking of chips and further improving the heat dissipation efficiency.

Figure 2:
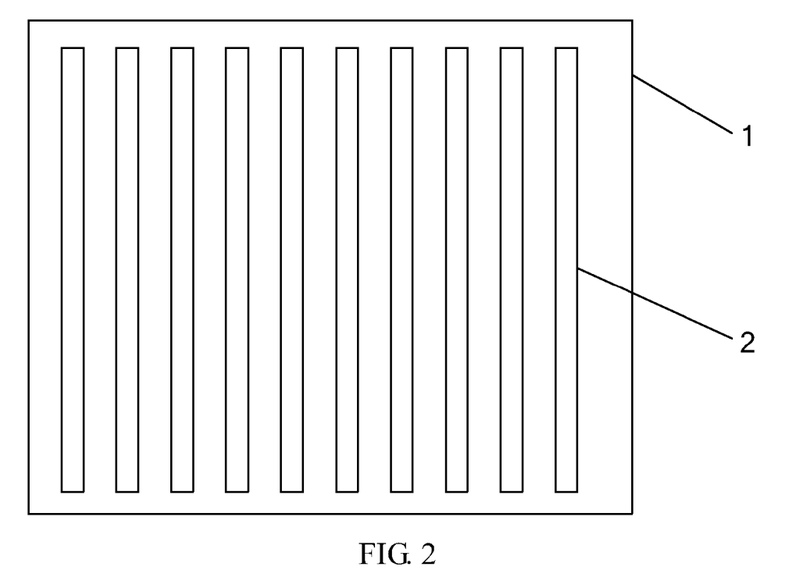
FIG. 2 is a schematic diagram where stacking substrates are arranged in one row and disposed in parallel on a main substrate according to an embodiment of the present invention.
Figure 3:
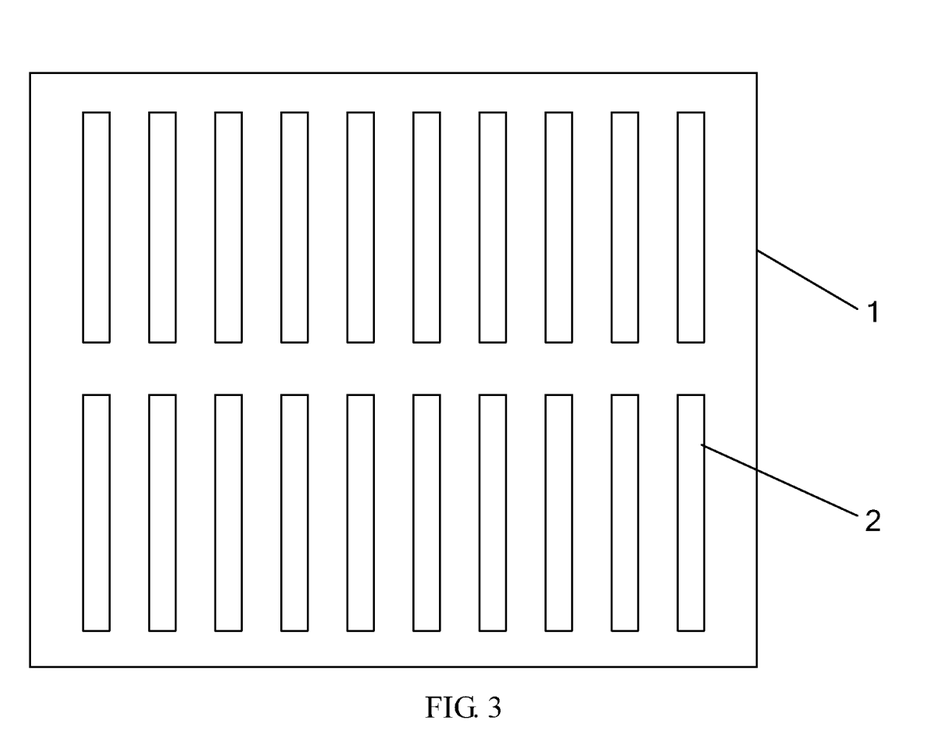
FIG. 3 is a schematic diagram where stacking substrates are arranged in two rows and disposed in parallel on a main substrate according to an embodiment of the present invention.
Figure 4:
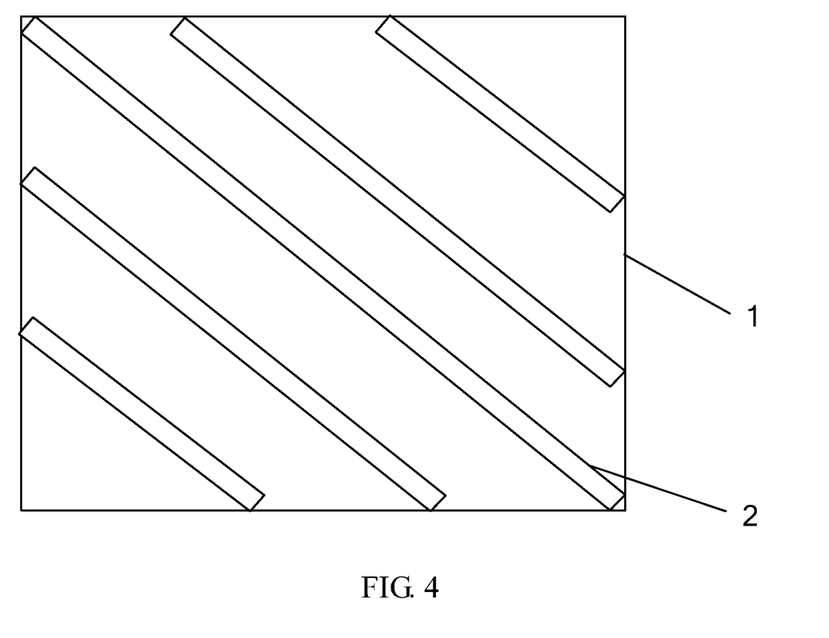
FIG. 4 is a schematic diagram where stacking substrates are disposed in parallel on a main substrate along a diagonal of the main substrate according to an embodiment of the present invention.

Further, the chip stacking packaging structure provided by the embodiment of the present invention includes a plurality of stacking substrates 2, and the plurality of stacking substrates 2 is spaced from each other. The stacking substrates 2 may be disposed on the main substrate 1 vertically according to various layouts. For example, as shown in FIG. 2, the stacking substrates 2 may be arranged in one row and disposed in parallel on the main substrate 1; as shown in FIG. 3, the stacking substrates 2 may be arranged in two rows and disposed on the main substrate 1, and stacking substrates 2 in each row are parallel to each other; and as shown in FIG. 4, the stacking substrates 2 may be disposed in parallel on the main substrate 1 along a diagonal of the main substrate 1. In the embodiment of the present invention, the layout of the stacking substrates 2 is not limited to the foregoing three manners, and a specific layout manner of the stacking substrates 2 on the main substrate 1 is not limited herein.

Figure 5:
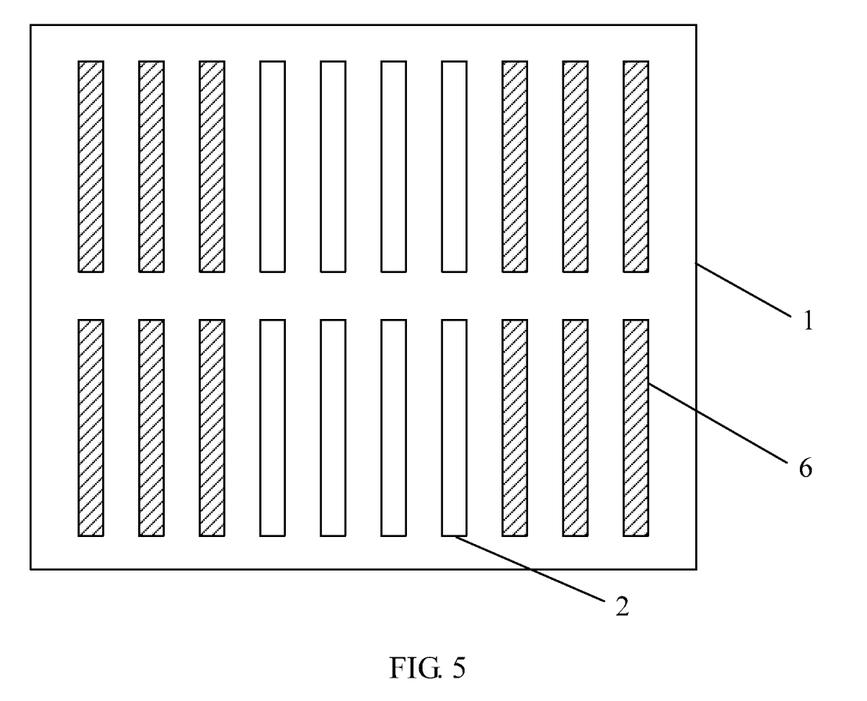
FIG. 5 is a schematic diagram where a heat radiating fin is disposed on a main substrate according to an embodiment of the present invention.

Further, as shown in FIG. 5, the chip stacking packaging structure provided by the embodiment of the present invention further includes at least one heat radiating fin 6, where the heat radiating fin 6 is disposed on the main substrate 1, and the heat radiating fin 6 and the stacking substrate 2 are spaced from each other. When the stacking substrate 2 is disposed perpendicularly, the heat radiating fin 6 may also be disposed on the main substrate 1 perpendicularly, so as to ensure that the heat radiating fin 6 and the stacking substrate 2 can be spaced from each other.

The heat radiating fin 6 and the stacking substrate 2 may be disposed on the main substrate 1 in a mixed manner, and the heat radiating fin 6 functions like a radiating tooth in a metal radiator, thereby further facilitating heat dissipation of the chip stacking packaging structure.

Figure 6:
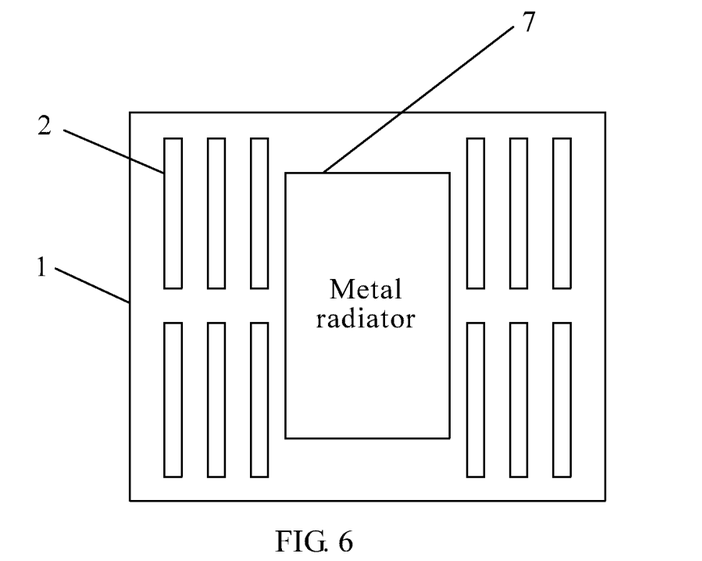
FIG. 6 is a schematic diagram where a metal radiator is disposed on the main substrate according to an embodiment of the present invention.
Figure 7:
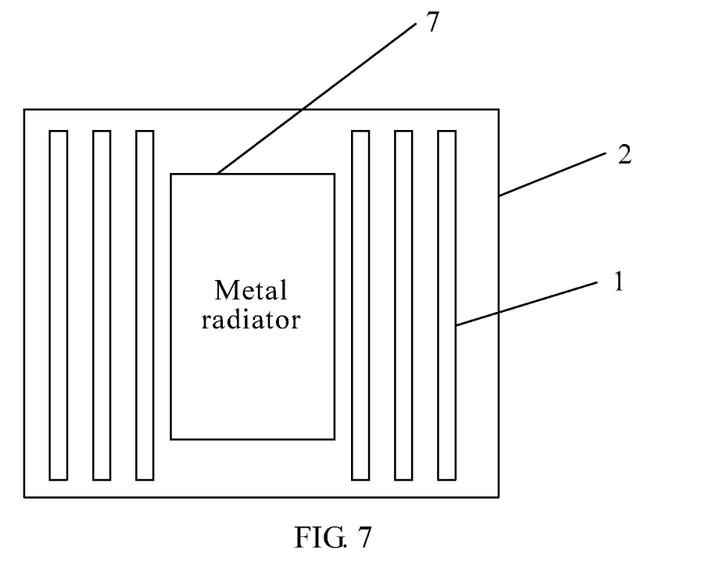
FIG. 7 is a schematic diagram where stacking substrates are arranged in one row and disposed on two sides of a metal radiator according to an embodiment of the present invention.

Further, as shown in FIG. 6 and FIG. 7, the chip stacking packaging structure provided by the embodiment of the present invention further includes a metal radiator 7, where the metal radiator 7 is disposed on the main substrate 1 and corresponds to a position at which the main chip is disposed, and the metal radiator 7 and the stacking substrate 2 are spaced from each other.

A certain space for installing the metal radiator 7 may be reserved in a central area of the main substrate 1, and the stacking substrates 2 are disposed surrounding the metal radiator 7. In this way, heat dissipation of the stacking chip and the main chip can be achieved more effectively. The metal radiator 7 may be disposed on the main substrate 1 vertically according to various layouts. For example, as shown in FIG. 6, the metal radiator 7 may be disposed in the central area of the main substrate 1, and the stacking substrates 2 may be arranged in two rows and disposed on two sides of the metal radiator 7; or as shown in FIG. 7, the stacking substrates 2 may be arranged in one row and disposed on two sides of the metal radiator 7. In the embodiment of the present invention, the layout of the metal radiator 7 and the stacking substrate 2 is not limited to the foregoing manners, and the specific layout manner of the metal radiator 7 and the stacking substrate 2 is not limited herein.

Figure 8:
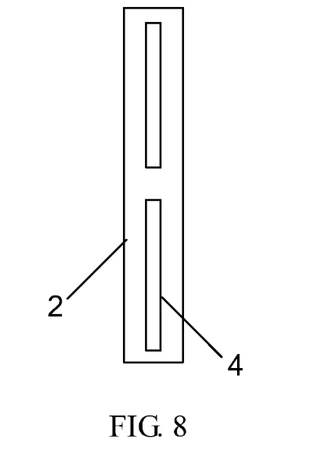
FIG. 8 is a schematic diagram where a stacking chip is disposed inside a stacking substrate according to an embodiment of the present invention.
Figure 9:
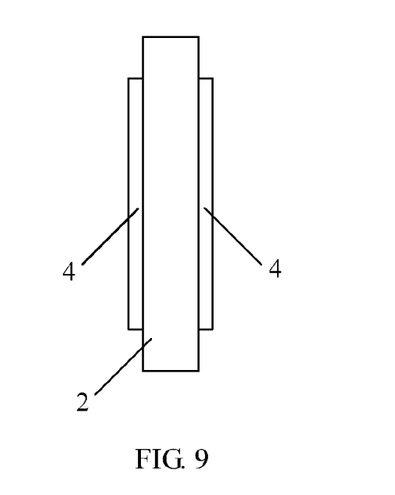
FIG. 9 is a schematic diagram where a stacking chip is disposed on a surface of a stacking substrate according to an embodiment of the present invention.

Further, in an embodiment of the present invention, the stacking chip is disposed on a surface of the stacking substrate or inside the stacking substrate. As shown in FIG. 8, the stacking chip 4 may be buried inside the stacking substrate 2, or as shown in FIG. 9, the stacking chip 4 may be surface-mounted to the stacking substrate 2.

Figure 10:
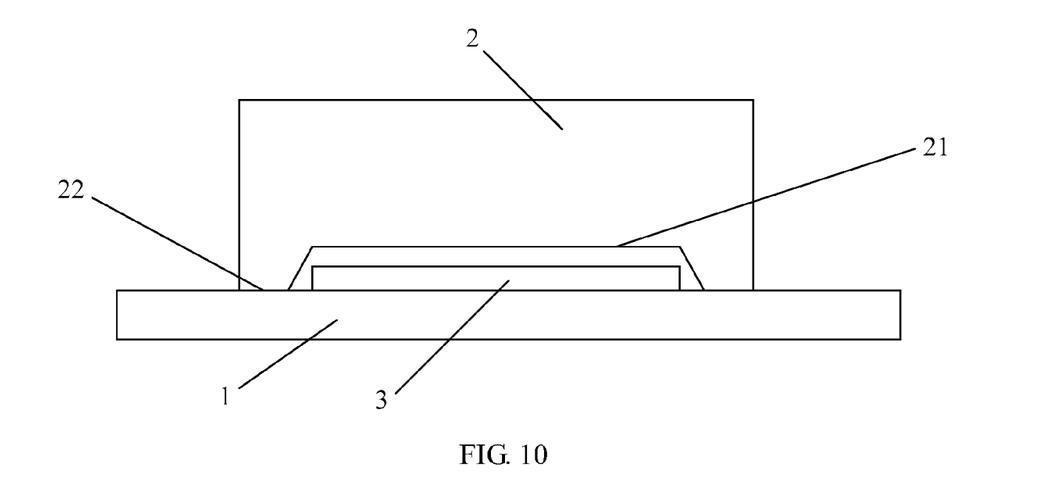
FIG. 10 is a schematic diagram where a main chip is disposed on a surface of a main substrate according to an embodiment of the present invention.

The main chip is disposed on a surface of the main substrate or inside the main substrate. As shown in FIG. 10, the main chip 3 may be surface-mounted to the main substrate 1. If the main chip 3 is disposed on the surface of the main substrate 1, the central area (that is, the area where the main chip is located) of the main substrate 1 may be used not for disposing the stacking substrate 2 but for disposing a metal radiator, or the stacking substrate 2 is disposed in the central area of the main substrate 1 in a bridging manner, that is, an area 21, which is located above the main chip 3, of the stacking substrate 2 is not connected to the main substrate 1, and an area 22, which extends beyond the main chip 3, of the stacking substrate 2 is connected to the main substrate 1.

Figure 11:
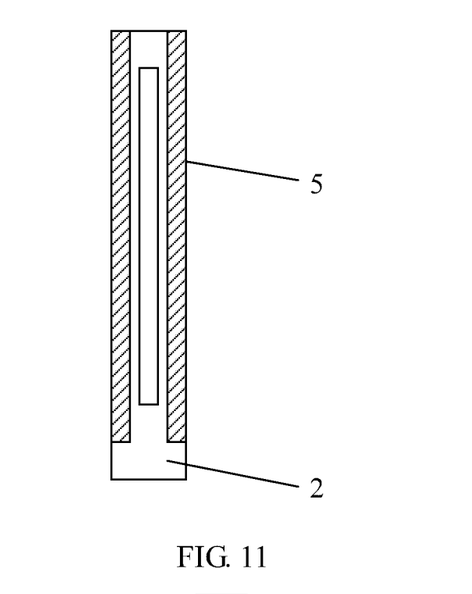
FIG. 11 is a schematic diagram where two surfaces of a stacking substrate are provided with a copper foil according to an embodiment of the present invention.
Figure 12:
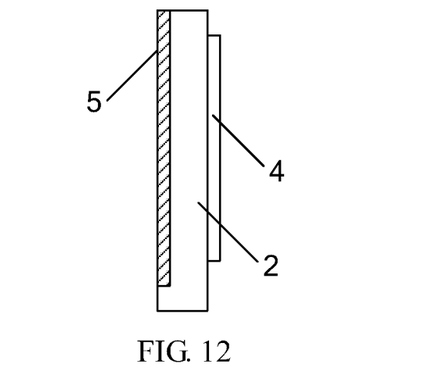
FIG. 12 is a schematic diagram where one surface of a stacking substrate is covered with a copper foil according to an embodiment of the present invention.

One surface or two surfaces of the stacking substrate and the heat radiating fin are covered with a copper foil. Covering a surface with a copper foil further improves the heat dissipation capability of the stacking substrate and the heat radiating fin. As shown in FIG. 11, both surfaces of the stacking substrate 2 may be covered with a copper foil 5. As shown in FIG. 12, one surface of the stacking substrate 2 may be covered with a copper foil 5, and the stacking chip 4 is disposed on the other surface of the stacking substrate 2.

Figure 13:
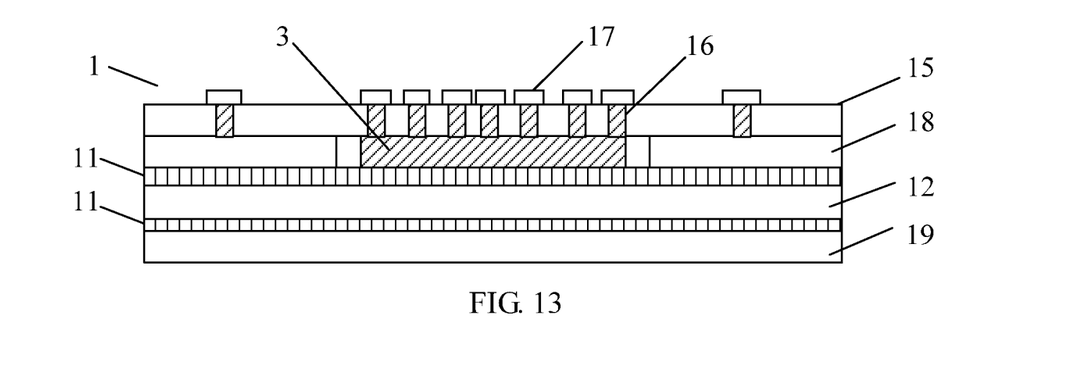
FIG. 13 is a schematic structural diagram of a main substrate according to an embodiment of the present invention.

Further, in an embodiment of the present invention, as shown in FIG. 13, the main substrate 1 includes a main chip substrate 12, circuit wiring 11, a laminated sheet 18, a main chip 3, a chip connection area 17, a lower surface substrate 19, and an upper surface substrate 15 provided with a plurality of connection holes 16. The circuit wiring 11 is disposed on an upper surface and a lower surface of the main chip substrate 12. The circuit wiring 11 may be of multiple layers, where the multiple layers of circuit wiring 11 are spaced from each other by the laminated sheet, and the laminated sheet may be a prepreg. The main chip 3 is disposed on the upper surface of the main chip substrate 12 and is connected to the circuit wiring 11. The laminated sheet 18 is disposed on the circuit wiring 11 on the upper surface of the main chip substrate 12. The upper surface substrate 15 is disposed on the main chip 3 and the laminated sheet 18. The lower surface substrate 19 is disposed below the circuit wiring 11 on the lower surface of the main chip substrate 12. Positions of the plurality of connection holes 16 correspond to a position of an input/output interface of the main chip 3 and a position of the circuit wiring 11 separately. A conductive medium is disposed in the connection holes 16, and the conductive medium is connected to the input/output interface of the main chip 3 or the circuit wiring 11. The chip connection area 17 covers openings at one side of the connection holes 16 that is distant from the main chip 3, and is connected to the conductive medium, that is, the chip connection area 17 is connected to the input/output interface of the main chip 3 or the circuit wiring 11 through the connection holes 16. The chip connection area 17 is used to connect the stacking substrate.

Figure 14:
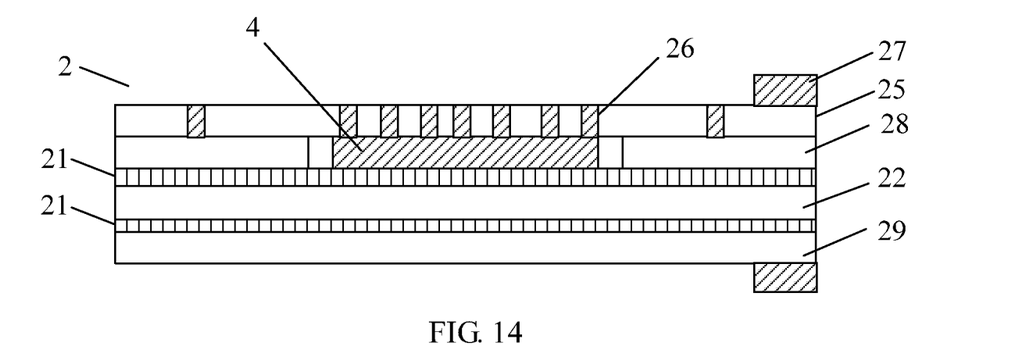
FIG. 14 is a schematic structural diagram of a stacking substrate according to an embodiment of the present invention.

As shown in FIG. 14, the stacking substrate 2 includes a stacking chip substrate 22, circuit wiring 21, a laminated sheet 28, a stacking chip 4, external wiring, a solder pad 27, a lower surface substrate 29, and an upper surface substrate 25 provided with a plurality of connection holes 26. The circuit wiring 21 is disposed on an upper surface and a lower surface of the stacking chip substrate 22. The circuit wiring 21 may be of multiple layers, where the multiple layers of circuit wiring 21 are spaced from each other by the laminated sheet 28, and the laminated sheet 28 may be a prepreg. The stacking chip 4 is disposed on the upper surface of the stacking chip substrate 22 and is connected to the circuit wiring 21. The laminated sheet 28 is disposed on the circuit wiring 21 on the upper surface of the stacking chip substrate 22. The upper surface substrate 25 is disposed on the stacking chip 4 and the laminated sheet 28. The lower surface substrate 29 is disposed below the circuit wiring 21 on the lower surface of the stacking chip substrate 22. Positions of the plurality of connection holes 26 correspond to a position of an input/output interface of the stacking chip 4 and a position of the circuit wiring 21 separately. A conductive medium is disposed in the connection holes 26, and the conductive medium is connected to the input/output interface of the stacking chip 4 or the circuit wiring 21. The solder pad 27 is disposed at a bottom end (the right side in the figure) of an outer side face (that is, a side distant from the stacking chip and the circuit wiring) of the upper surface substrate 25, and the solder pad 27 is used to connect the main substrate. The external wiring is disposed on the outer side face of the upper surface substrate 25, and two ends of the external wiring are connected to the solder pad 27 and the conductive medium separately, that is, the solder pad 27 is connected to the input/output interface of the stacking chip 4 and the circuit wiring 21 through the external wiring and the connection holes 26.

In the chip stacking packaging structure provided by the embodiment of the present invention, the stacking substrate is disposed on the main substrate perpendicularly, thereby achieving high-density stacking of chips; and the stacking chip is connected to the main chip vertically, so that the stacking substrate functions like a radiating tooth in a metal radiator. In this way, in a case of forced air cooling, heat of the chips can be quickly taken away, and thermal interference between the chips is avoided. Since the heat radiating fin or the metal radiator dedicated for heat dissipation is disposed on the main substrate, efficient heat dissipation of the stacked chips can be achieved effectively. In addition, since the stacking substrate is disposed on the main substrate vertically, a length of wiring between the stacking chip and the main chip is greatly reduced compared with the prior art, thereby improving electrical performance of the chip packaging structure.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A chip stacking packaging structure comprising:
   a main substrate; and
   at least one stacking substrate,
   wherein a main chip is disposed in the main substrate,
   wherein at least one stacking chip is disposed on the stacking substrate,
   wherein a side edge of the stacking substrate is disposed on the main substrate, so that the stacking chip is connected to the main chip,
   wherein the stacking chip is disposed on a surface of the stacking substrate, and
   wherein the main chip is disposed inside the main substrate.

2. The structure according to claim 1, wherein the stacking substrate is disposed on the main substrate perpendicularly.

3. The structure according to claim 1, wherein the at least one stacking substrate comprises a plurality of stacking substrates, and wherein the plurality of stacking substrates are spaced from each other.

4. The structure according to claim 1, wherein one surface of the stacking substrate is covered with a copper foil.

5. The structure according to claim 1, wherein two surfaces of the stacking substrate are covered with a copper foil.

6. The structure according to claim 3, wherein the structure further comprises at least one heat radiating fin, wherein the heat radiating fin is disposed on the main substrate, and wherein the heat radiating fin and the stacking substrate are spaced from each other.

7. The structure according to claim 6, further comprising a metal radiator, wherein the metal radiator is disposed on the main substrate and corresponds to a position at which the main chip is disposed, and wherein the metal radiator and the stacking substrate are spaced from each other.

8. A chip stacking packaging structure comprising:
   a main substrate; and
   at least one stacking substrate,
   wherein a main chip is disposed in the main substrate,
   wherein at least one stacking chip is disposed on the stacking substrate,
   wherein a side edge of the stacking substrate is disposed on the main substrate, so that the stacking chip is connected to the main chip,
   wherein the stacking chip is disposed inside the stacking substrate, and
   wherein the main chip is disposed inside the main substrate.

9. A chip stacking packaging structure comprising:
   a main substrate; and
   at least one stacking substrate,
   wherein a main chip is disposed in the main substrate,
   wherein at least one stacking chip is disposed on the stacking substrate,
   wherein a side edge of the stacking substrate is disposed on the main substrate, so that the stacking chip is connected to the main chip, and
   wherein the main substrate comprises:
      a main chip substrate;
      circuit wiring;
      a laminated sheet;
      a main chip;
      a chip connection area;
      a lower surface substrate; and
      an upper surface substrate provided with a plurality of connection holes, wherein the circuit wiring is disposed on an upper surface and a lower surface of the main chip substrate, wherein the main chip is disposed on the upper surface of the main chip substrate and is connected to the circuit wiring, wherein the laminated sheet is disposed on the circuit wiring on the upper surface of the main chip substrate, wherein the upper surface substrate is disposed on the main chip and the laminated sheet, wherein the lower surface substrate is disposed below the circuit wiring on the lower surface of the main chip substrate, wherein positions of the plurality of connection holes correspond to a position of an input/output interface of the main chip and a position of the circuit wiring separately, wherein a conductive medium is disposed in the connection holes, wherein the conductive medium is connected to the input/output interface of the main chip or the circuit wiring, wherein the chip connection area covers openings at one side of the connection holes that is distant from the main chip, and is connected to the conductive medium, and wherein the chip connection area is used to connect the stacking substrate.

10. A chip stacking packaging structure comprising:
   a main substrate; and
   at least one stacking substrate,
   wherein a main chip is disposed in the main substrate,
   wherein at least one stacking chip is disposed on the stacking substrate,
   wherein a side edge of the stacking substrate is disposed on the main substrate, so that the stacking chip is connected to the main chip, and
   wherein the stacking substrate comprises:
      a stacking chip substrate;
      circuit wiring;
      a laminated sheet;
      a stacking chip;
      external wiring;
      a solder pad;
      a lower surface substrate; and
      an upper surface substrate provided with a plurality of connection holes, wherein the circuit wiring is disposed on an upper surface and a lower surface of the stacking chip substrate, wherein the stacking chip is disposed on the upper surface of the stacking chip substrate and is connected to the circuit wiring, wherein the laminated sheet is disposed on the circuit wiring on the upper surface of the stacking chip substrate, wherein the upper surface substrate is disposed on the stacking chip and the laminated sheet, wherein the lower surface substrate is disposed below the circuit wiring on the lower surface of the stacking chip substrate, wherein positions of the plurality of connection holes correspond to a position of an input/ output interface of the stacking chip and a position of the circuit wiring separately, wherein a conductive medium is disposed in the connection holes, wherein the conductive medium is connected to the input/output interface of the stacking chip or the circuit wiring, wherein the solder pad is disposed at a bottom end of an outer side face of the upper surface substrate, and the solder pad is used to connect the main substrate, wherein the external wiring is disposed on the outer side face of the upper surface substrate, and wherein two ends of the external wiring are connected to the solder pad and the conductive medium separately.

* * * * *

UNITED STATES PATENT AND TRADEMARK OFFICE
CERTIFICATE OF CORRECTION

| | | |
|---|---|---|
| PATENT NO. | : 9,257,358 B2 | Page 1 of 1 |
| APPLICATION NO. | : 14/552674 | |
| DATED | : February 9, 2016 | |
| INVENTOR(S) | : Weifeng Liu | |

It is certified that error appears in the above-identified patent and that said Letters Patent is hereby corrected as shown below:

On the title page, item (30), the Foreign Application Priority Data should read:

May 25, 2012    (CN) ..................................... 201210165554.8

Signed and Sealed this
Ninth Day of August, 2016

Michelle K. Lee
*Director of the United States Patent and Trademark Office*